United States Patent [19]

Simmonds

[11] Patent Number: 5,053,834
[45] Date of Patent: Oct. 1, 1991

[54] HIGH SYMMETRY DC SQUID SYSTEM
[75] Inventor: Michael B. Simmonds, Del Mar, Calif.
[73] Assignee: Quantum Magnetics, Inc., San Diego, Calif.
[21] Appl. No.: 576,600
[22] Filed: Aug. 31, 1990
[51] Int. Cl.5 .................... H01L 39/22; G01R 33/02; G01R 33/035; G11C 11/44
[52] U.S. Cl. .......................................... 357/5; 505/1; 505/702; 505/828; 505/832; 505/845; 505/846; 324/247; 324/248
[58] Field of Search ............................. 357/5; 307/306; 324/247, 248; 505/1, 702, 828, 832, 845, 846

[56] References Cited
U.S. PATENT DOCUMENTS

| | | | |
|---|---|---|---|
| 4,117,503 | 9/1978 | Zappe | 357/5 |
| 4,389,612 | 6/1983 | Simmonds et al. | 324/248 |
| 4,509,018 | 4/1985 | Gershenson | 307/306 |
| 4,588,947 | 5/1986 | Ketchen | 324/248 |
| 4,761,611 | 8/1988 | Hoenig | 307/306 |
| 4,771,239 | 9/1988 | Hoenig | 307/306 |
| 4,947,118 | 8/1990 | Fujimaki | 307/306 |

FOREIGN PATENT DOCUMENTS 0327123 8/1989 European Pat. Off. ............ 324/248

Primary Examiner—Rolf Hille
Assistant Examiner—Mahshid Saadat
Attorney, Agent, or Firm—Baker, Maxham, Jester & Meador

[57] ABSTRACT

A thin film dc SQUID and its driving electronic circuitry configured with very high symmetry. The SQUID loop is formed with four holes at the respective ends of crossed slits. Each of these holes forms a single turn secondary for symmetrically arranged pairs of modulation coils and signal coils. The geometrical placement of the modulation coil transformers with respect to the signal coil transformers results in a device which nominally has no mutual inductance between the two groups of coils when the SQUID is biased for normal operation. The external driving circuit is configured to preserve the highly balanced nature of the chip and forces equal magnitudes of current to flow in all four of the bias leads.

49 Claims, 3 Drawing Sheets

HIGH SYMMETRY DC SQUID SYSTEM

FIELD OF THE INVENTION

This invention is generally concerned with a dc SQUID system and more particularly with such a system which utilizes very high symmetry in the geometry of a thin film SQUID chip and in the configuration of the electronic circuits which drive the chip.

BACKGROUND OF THE INVENTION

Superconducting quantum interference devices (SQUID) have been commercially available for several years. SQUIDs are the most sensitive magnetic field or small voltage sensors currently available. The operation of SQUID sensors is based on two effects which can be observed only in the presence of superconductivity. These are flux quantization and Josephson effects. SQUID sensors generally use one or two Josephson junctions connected in a closed superconducting loop.

SQUID systems have taken on a number of different forms but what has become an accepted form for thin film implementations is the "washer" design which achieves low inductance in the SQUID loop and tight coupling to multi-turn input coils by making the loop into a slotted groundplane. This design resulted in the first practical thin film SQUID to be realized in a planar geometry. Very sensitive, low-noise devices with usefully large input coil inductance have been fabricated over the years using this design.

A modulation coil of this traditional design comprises a single turn loop around the outside of the multi-turn signal coil. This results in high mutual inductance between the modulation and input coils, which is undesirable in a practical system because drive currents injected into the modulation coil will appear as an output from the signal coil. This is analogous to the problem created by using an unbalanced mixer in radio receiver circuitry.

For many applications, it is not desired that the SQUID loop itself be sensitive to uniform magnetic fields because magnetic flux should only be coupled into it through the signal coil. It is possible to fabricate double washer designs in which the two washers are configured as a gradiometer to reject the effects of uniform fields. In these designs, however, the bias current which must pass through the Josephson junctions becomes magnetically coupled into the SQUID loop. This results in an undesirable interaction which can introduce noise and drift into the SQUID sensor from the drive electronics.

The non-symmetrical way in which bias currents are introduced into the junctions also makes the SQUID unduly sensitive to common mode noise which may be picked up on the bias leads which run from the electronic drive package at room temperature down to the SQUID sensor in the cryogenic environment. Again, this noise becomes an influence on the output signal.

SUMMARY OF THE INVENTION

Broadly speaking, this invention is concerned with a SQUID system which nominally has no mutual inductance between groups of signal coils and modulation coils when the SQUID is biased for normal operation. Currents flowing in the modulation coil are not coupled into the input coil. This makes the device more unilateral which is a desirable feature. Further, currents flowing into the junctions are not coupled to the SQUID loop. This makes the device more insensitive to fluctuations or noise in the bias current circuitry. Additionally, common mode noise on the bias leads, modulation coils or signal coils does not couple into the junctions.

These improvements are accomplished by using very high symmetry in the geometry of the thin film SQUID chip and in the configuration of the electronic circuitry which drives the chip. The SQUID loop is configured with four "holes" located at the ends of crossed slits. Each of these holes forms a single turn secondary for two modulation coils arranged symmetrically with respect to two signal coils. The modulation and signal coils are each connected in series with the winding sense set so that currents in the coils generate "aiding" currents in the SQUID loop itself.

Four separate electrical leads are provided by which the junctions are biased. Two of the leads are connected to one side of the parallel Josephson junctions, while the other two leads are connected to the large groundplane structure of the SQUID loop. The external circuit is designed to preserve the highly balanced nature of the chip and force equal magnitudes of current to flow in all four of the bias leads.

BRIEF DESCRIPTION OF THE DRAWING

The objects, advantages and features of this invention will be more clearly perceived from the following detailed description, when read in conjunction with the accompanying drawing, in which.

DESCRIPTION OF THE PREFERRED EMBODIMENT

Figure 1:
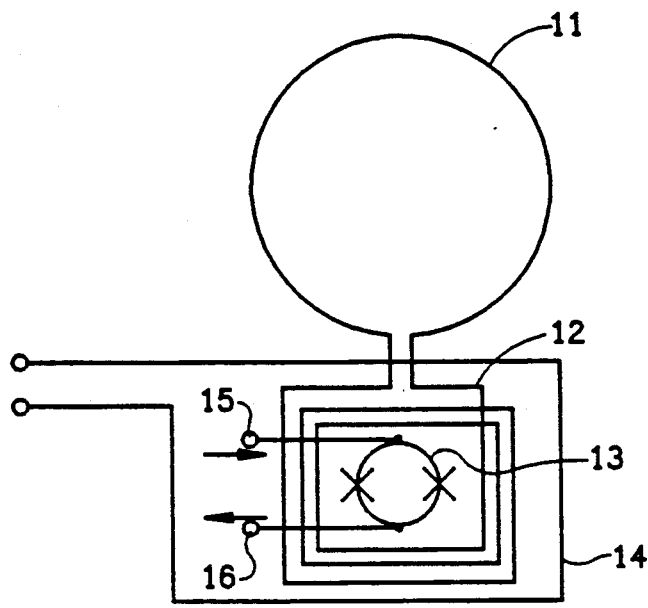
FIG. 1 is a circuit diagram of the prior art washer design dc SQUID with an integrated flux transformer and a modulation coil.
Figure 2:
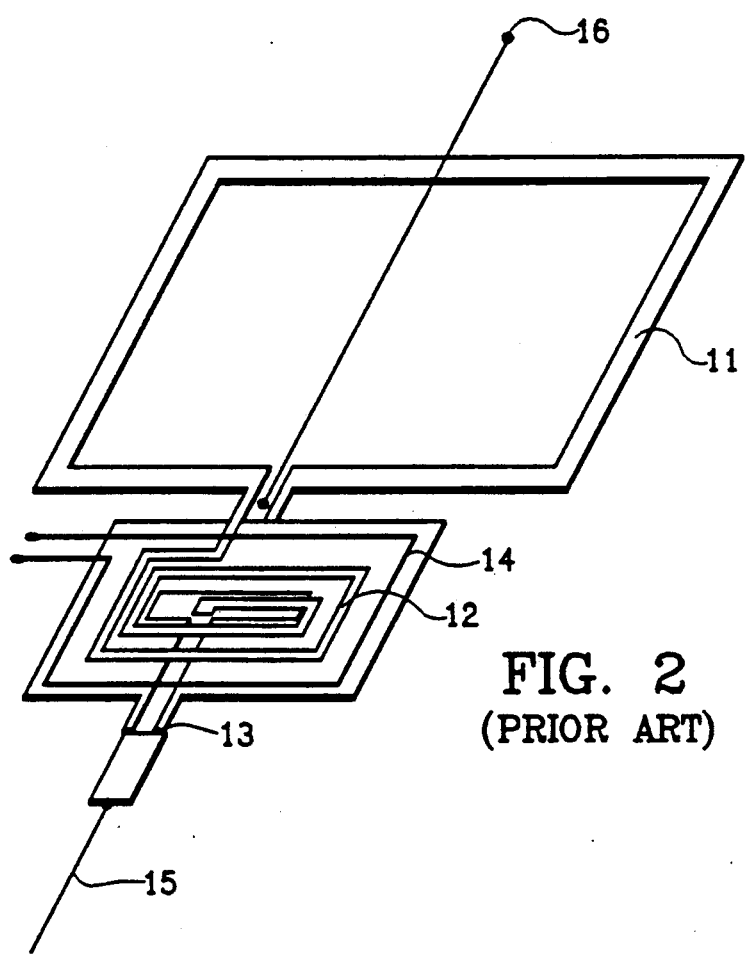
FIG. 2 is a perspective schematic layout of the thin-film device of FIG. 1.

With reference now to the drawing, and more particularly to FIGS. 1 and 2 thereof, the classic washer design is shown with its integrated pick-up loop connected to the signal coil. Specifically, pick-up loop 11 is connected to signal coil 12 which is coupled with SQUID loop 13. Single turn modulation coil 14 is positioned around the outside of multi-turn signal coil 12. As stated previously, this results in high mutual inductance between the modulation and input coils. This can be undesirable in a practical system because drive currents injected into the modulation coil appear as an output from the signal coil. Junction bias leads 15 and 16 are more graphically shown in FIG. 2.

Figure 3:
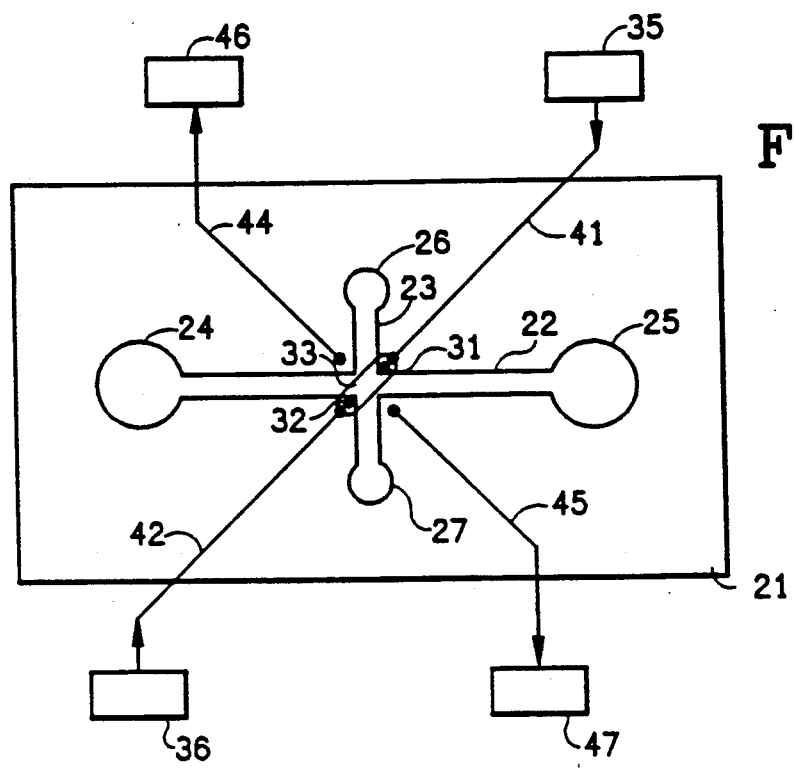
FIG. 3 is a plan view of the junction and wiring layers of the SQUID, constructed in accordance with the invention.

The present invention will now be discussed. The junction layer, which includes the base layer and the wiring layer, is shown in FIG. 3. Base or ground plane layer 21 is normally a sheet of niobium in the range of 200 nm thick deposited on an insulative substrate. This configuration employs the washer design but in a balanced arrangement. Slits 22 and 23 are formed in a crossed relationship in the niobium layer at about a 90-degree angle. At the end of slit 22 are holes 24 and 25 which form the single turn secondaries for the two signal transformers of the SQUID. Similarly, holes 26 and 27 are positioned at opposite ends of slit 23 and form the single turn secondaries for the modulation coils. The Josephson junctions are represented by small circles 31 and 32 near the intersection of the slits. These junctions are interconnected through the wiring layer by means of connecting link 33 which is above an insulating layer above niobium base layer 21 and makes electrical contact to the base layer only at the point of the Josephson junctions. A resistor layer and a further insulation layer are mounted above those shown in FIG. 3 in conventional fashion. These layers and elements are not shown.

Input bias is provided on niobium contact pads 35 and 36 and connected to the Josephson junctions through link 33 by means of respective superconductive wire paths or leads 41 and 42. In order to complete the circuitry, output bias leads 44 and 45 are connected to respective niobium contact pads 46 and 47.

Figure 4:
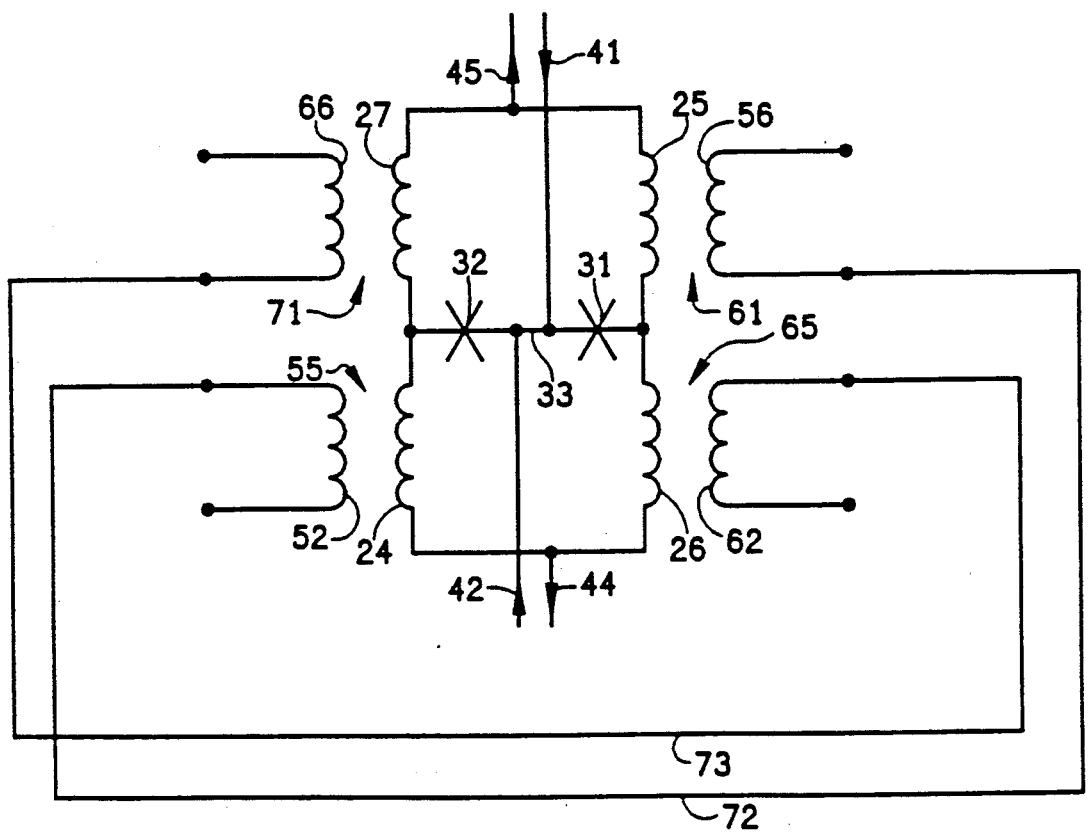
FIG. 4 shows the transformer circuitry of the FIG. 3 structure.

This circuitry, which constitutes the SQUID loop, and the modulation and signal coils which inductively couple to single turn secondaries 24, 25, 26 and 27, are shown schematically in FIG. 4. Josephson junctions 31 and 32 are interconnected by means of link 33 to which are connected input bias leads 41 and 42. Output bias lead 44 is connected between signal coil 24 and modulation coil 26. Output bias lead 45 is connected between signal coil 25 and modulation coil 27. FIG. 4 also effectively provides a conceptual bridge between FIG. 3 and FIG. 5.

Figure 5:
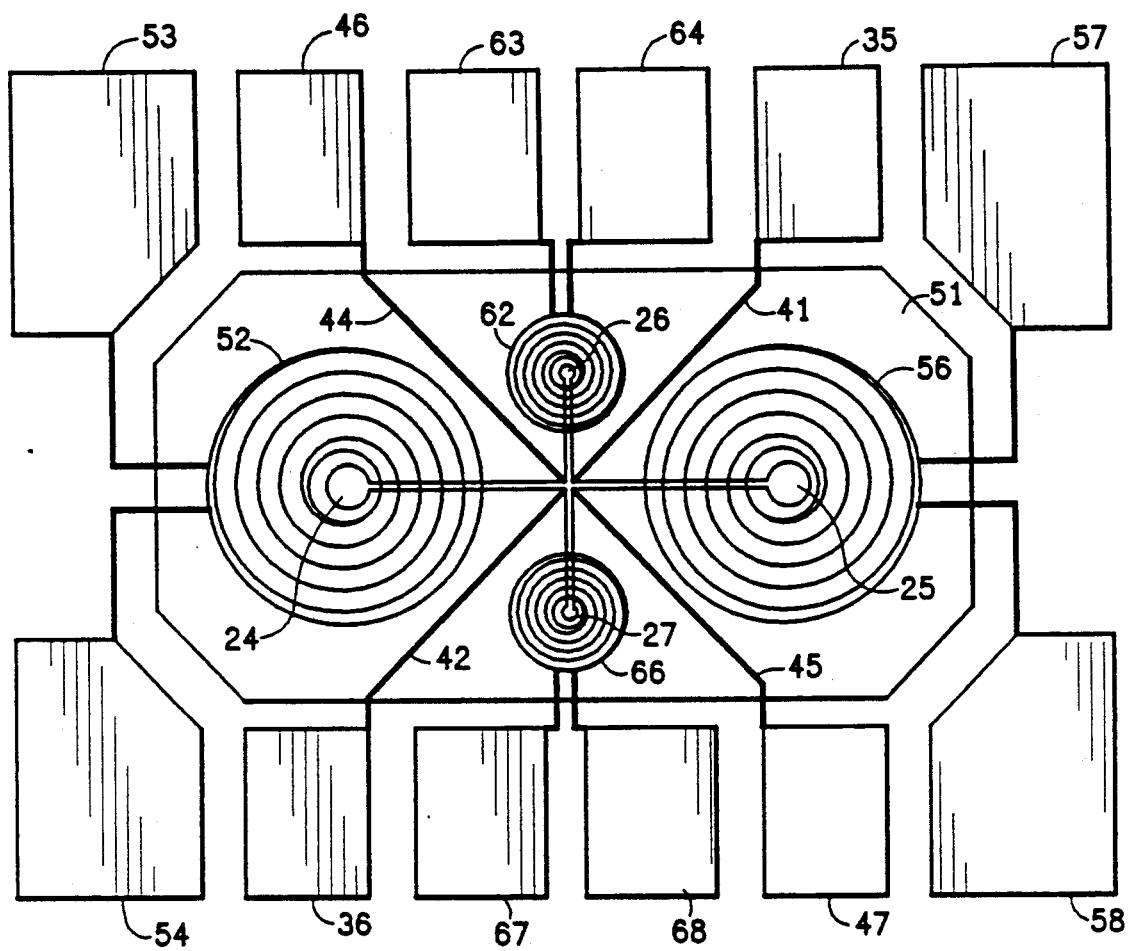
FIG. 5 is a plan view of the coil layer of the balanced SQUID design of the present invention.

The next layer above a silicon monoxide insulation layer (not shown) above the circuitry of FIG. 3, which insulation layer is typically about 300 nm thick, is the coil layer shown in FIG. 5. Signal coil 52 is connected to niobium pads 53 and 54. This coil is the other portion of signal transformer 55 shown in FIG. 4. Signal coil 56 is connected to niobium contact pads 57 and 58 and form the other coil of signal transformer 61. Modulation coil 62 is connected to niobium contact pads 63 and 64 and forms the other coil of modulation transformer 65. Modulation coil 66 is connected to niobium contact pads 67 and 68 and forms the other coil of modulation transformer 71. Input bias leads 41 and 42 and output bias leads 44 and 45 are also represented in FIG. 5.

With respect to FIG. 4, note the series connection of signal coils 52 and 56 by means of connecting lead 72. Modulation coils 62 and 66 are connected in series by means of lead 73. The unconnected ends of the signal and modulation coils shown in FIG. 4 are connected to external circuitry or components in normal fashion as would be clear to one skilled in the art for this type of SQUID.

Figure 6:
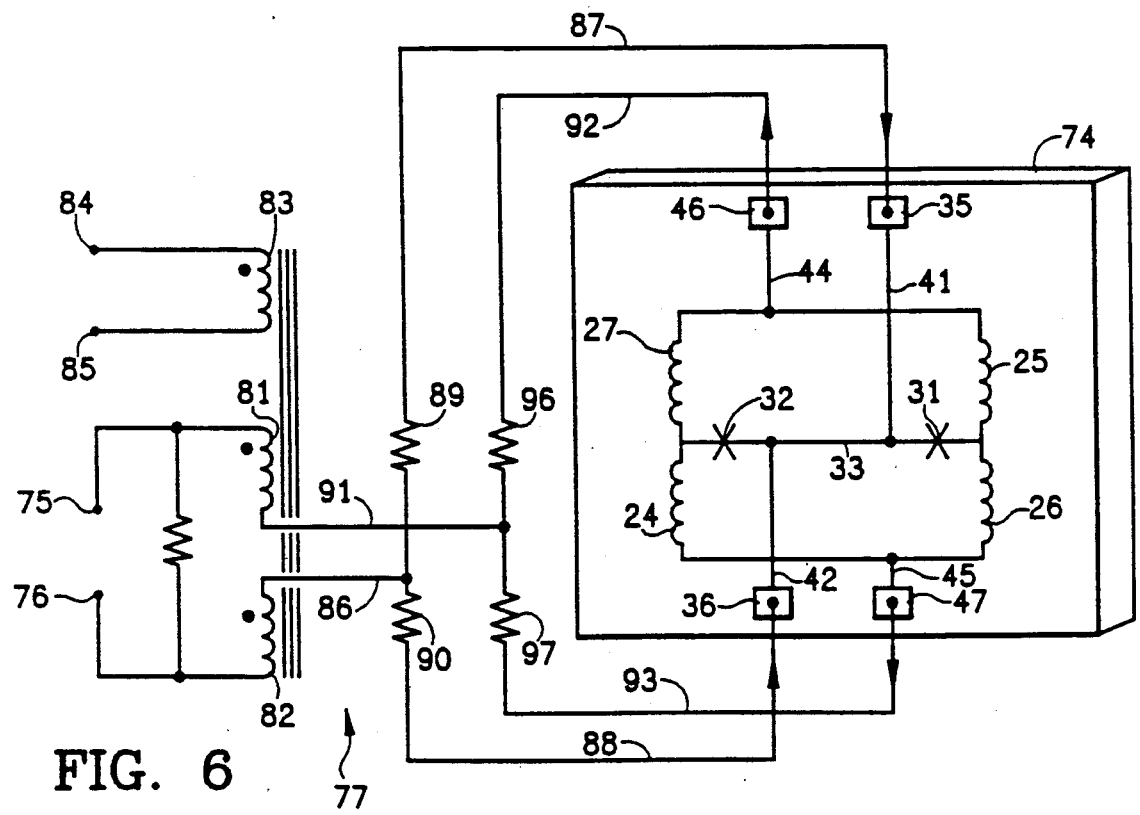
FIG. 6 is a schematic of the circuitry for introducing bias current and extracting the output signal from the chip of FIG. 2.

The circuit of FIG. 6 shows the manner in which the bias current is introduced to the SQUID chip and how the output signal is extracted therefrom. The SQUID loop is shown on chip 74. The bias signal is applied to terminals 75 and 76 of step-up transformer 77. This transformer has a split primary comprising coils 81 and 82. The secondary of transformer 77 comprises signal output coil 83 which provides an output on terminals 84 and 85. The step-up function of this transformer is provided by the fact that the split primary comprises very few turns for each coil, possibly about three turns each, while the secondary may have in the order of 70 turns. The input bias signal is applied to leads 41 and 42 through niobium contact pads 35 and 36 by means of lead 86 from transformer primary 82 to balanced leads 87 and 88. Leads 87 and 88 are typically segments of gold bond wire, the resistance of which is represented by resistors 89 and 90. That resistance value may be in the range of about 0.01 ohms. The output bias signals are provided to lead 91 of coil 81 from balanced leads 92 and 93 connected to chip leads 44 and 45 through niobium contact pads 46 and 47. These leads are similar to leads 87 and 88 and their resistances 96 and 97 are also similar. The use of a transformer for the bias input and signal output is well known as it provides a voltage step-up to minimize the effects of resistance in the signal leads running all the way up to room temperature. The specific design of the transformer shown in FIG. 6 is not previously known for use with a SQUID and is employed to preserve the high symmetry of the four bias leads used to carry current to the junctions, thereby enhancing the symmetrical effects of the structure shown in FIGS. 3-5.

The junctions are fabricated on silicon wafers using the well known niobium/aluminum oxide/niobium trilayer process. After the base electrode and junction areas are patterned by plasma etching to form the base layer on the silicon wafer, the surface is selectively insulated with a patterned silicon monoxide layer. Then a wiring layer of sputtered niobium is deposited to form the interconnections between the junctions and to form the leads which carry current to the junctions, namely, bridge element 33 and leads 41 and 42. This layer also provides the insulated underpass which carries current to the center of the modulation and signal coils. These would be the leads from contact pads 54, 58, 63 and 68 as shown in FIG. 5. Resistors made from a palladium alloy are next deposited, comprising the resistor layer. These are not shown in the drawing but are conventional technology well known to those skilled in the art.

Another insulating layer of silicon monoxide is then evaporated over the surface and patterned using standard "lift-off" techniques. The niobium coils shown in FIG. 5 are then deposited on the silicon monoxide layer using either lift-off or plasma etching techniques. Finally, appropriate coatings are provided on the bonding pad areas as desired.

After fabrication, the wafer is diced into 0.075×0.150 inch chips and mounted to a non-conductive, non-magnetic carrier. Gold wires are typically ultrasonically bonded to the chip to make connections for the bias current and modulation coil since it is not required that these wires be superconducting. Examples of these gold wires are leads 87, 88, 92 and 93. The connections to the signal coil are made by small leads, preferably made of niobium bonded to the pads of the chip. These leads are superconducting.

As shown in FIG. 5, the SQUID loop is configured to have four "holes" located at the ends of crossed slits, which holes constitute the single turn secondaries for the modulation signal coils. The series connection of the modulation coils and the signal coils (FIG. 4) are done with the winding sense of each pair set so that currents in the coils generate "aiding" currents in the SQUID loop itself.

The geometrical placement of the modulation coil transformers with respect to the signal coil transformers results in a device which nominally has no mutual inductance between the two groups when the SQUID is biased for normal operation.

This configuration provides four separate electrical leads by which the junctions are biased. Two of the leads (41 and 42) are diagonally located and are connected to one side of the parallel Josephson junctions (see FIGS. 3 and 4), while the other two leads (44 and 45) are connected to large groundplane 21 of the SQUID loop.

The novel external circuit as shown in FIG. 6 preserves the highly balanced nature of the chip and forces equal magnitudes of current to flow in all four of the bias leads. It also permits optimal detection of the voltage which is developed across the junctions. This voltage is influenced by the current flowing in the modulation and signal coils and represents the amplified output of the SQUID sensor.

This biasing arrangement ensures that dc currents flowing into the junctions are not coupled magnetically into either the SQUID loop, the modulation coil or the signal coil, as long as the electrical characteristics of the two Josephson junctions on the chip are reasonably well matched. Techniques for achieving such matching are well known.

This invention provides a SQUID with several advantages over previously available devices. Currents flowing in the modulation coils are not coupled into the input coils. This makes the device more "unilateral" which is desirable for this device for the same reasons that unilateral circuits are advantageous in the design of active rf amplifiers.

Another advantage is that currents flowing into the junctions are not coupled to the SQUID loop. This makes the device more insensitive to fluctuations or noise in the bias current circuitry. This insensitivity to current flow allows one to reverse the direction of bias current with a minimum disturbance to the flux state of the SQUID loop. This is useful in the application of various noise reduction techniques which rely on the reversal of the bias current to the device.

An additional advantage of this invention is that common mode noise on the bias leads, the modulation coils or the signal coils does not couple into the junctions. The balanced way in which external signals are introduced onto the chip insures that the capacitive and inductive couplings are equal from both sides of the line. This makes the chip inherently more robust in the face of electromagnetic interference coming either from the control electronics or from the input circuitry of the system.

Prior SQUID devices using the washer configuration have been applicable for laboratory uses but have had significant limitations in commercial applications. The device of this invention, because of its structure with accompanying advantages over the prior art, is directly useable in many commercial applications. These include magnetometers for medical, biological, geophysical and materials science applications. SQUIDs made in accordance with this invention can also be used as extremely sensitive current detectors for a wide range of laboratory measurements.

The invention has been described as having a full range of balanced, symmetrical aspects, relating primarily to the signal coils, modulation coils and the input bias current. However, the structure of the invention will operate in the above described improved fashion to make acceptable commercial SQUID devices with less than all of the carefully balanced, symmetrical elements described. For example, the balanced modulation coils contribute to the improved operation of the SQUID device even if the signal coils are not precisely symmetrical and balanced. The same is true if the input bias current is precisely symmetrical and balanced even if the modulation and signal coils are not necessarily so balanced. Also if the signal coils are precisely balanced, the device will operate satisfactorily even though the modulation coils and bias currents are not precisely balanced and symmetrical.

The device has been described as shown with the holes at the end of the slits in the superconductive groundplane layer, which forms the SQUID loop, as generally round. Note that in the prior art as shown in FIG. 2 the central opening in the washer design is shown as square or rectangular. It has been found that these holes or openings in the SQUID loop need not have any particular shape, and may be square, round, hexagonal or any other practical and achievable shape.

Niobium has been described as the superconductive element of choice for several elements of this SQUID system. Of course, the invention is not limited to any particular materials. It is the structure and the functions produced by the structure that are the subjects of this invention.

In view of the above description it is likely that modifications and improvements will occur in those skilled in the art which are in the scope of the accompanying claims.

What is claimed is:

1. A balanced thin film dc SQUID system comprising:
   a substrate;
   a superconductive groundplane layer on said substrate formed with first and second slits forming a mutual intersection intermediate their ends, each said slit having enlarged openings at the end thereof;
   thin film Josephson junction means located on diagonally opposite corners of said groundplane at said intersection of said slits, said Josephson junction means being part of a SQUID loop;
   means for interconnecting said Josephson junction means across said intersection;
   a thin film signal coil in coupling relationship with each said enlarged opening at opposite ends of one of said first and second slits;
   an electrically balanced, physically symmetrical pair of thin film modulation coils, each said modulation coil being in coupling relationship with one of said enlarged openings at opposite ends of the other of said first and second slits; and
   means for applying bias current to said Josephson junction means so as to not disturb the symmetry created by said modulation coil arrangement.

2. The SQUID system recited in claim 1, wherein said groundplane is formed of niobium.

3. The SQUID system recited in claim 1, wherein said slits are oriented at about ninety degrees with respect to each other.

4. The SQUID system recited in claim 1, wherein at least some of said enlarged openings are generally round.

5. The SQUID system recited in claim 1, wherein said signal coils are electrically balanced and physically symmetrical with respect to each other and are physically symmetrical with respect to said modulation coils.

6. The SQUID system recited in claim 1, wherein said bias current is applied to said Josephson junction means in an electrically balanced, physically and electrically symmetrical manner.

7. The SQUID system recited in claim 5, wherein said bias current is applied to said Josephson junction means in an electrically balanced, physically and electrically symmetrical manner.

8. The SQUID system recited in claim 6, wherein said bias current is applied by means of a split primary transformer with the current therefrom being applied to opposite sides of said SQUID loop.

9. The SQUID system recited in claim 7, wherein said bias current is applied by means of a split primary transformer with the current therefrom being applied to opposite sides of said SQUID loop.

10. The SQUID system recited in claim 1, wherein said means for interconnecting said Josephson junction means comprises a superconducting bridge.

11. The SQUID system recited in claim 10, wherein input bias current is applied to said superconducting bridge adjacent each respective Josephson junction means by means of a symmetrical split primary transformer.

12. The SQUID system recited in claim 1, wherein the output bias current is connected between one of the primary coils of a split primary transformer for said bias current and to symmetrically positioned locations on said groundplane on diagonally opposite corners of said intersection other than the corners which contain said Josephson junction means.

13. The SQUID system recited in claim 1, wherein said modulation coils are connected together in current aiding series and said signal coils are connected together in current aiding series.

14. A balanced thin film dc SQUID system comprising:
  a substrate;
  a superconductive groundplane layer on said substrate formed with first and second slits forming a mutual intersection intermediate their ends, each said slit having enlarged openings at the end thereof;
  thin film Josephson junction means located on diagonally opposite corners of said groundplane at said intersection of said slits, said Josephson junction means being part of a SQUID loop;
  means for interconnecting said Josephson junction means across said intersection;
  a thin film signal coil in coupling relationship with each said enlarged opening at opposite ends of one of said first and second slits;
  a pair of thin film modulation coils, each said modulation coil being in coupling relationship with one of said enlarged openings at opposite ends of the other of said first and second slits; and
  means for symmetrically applying bias current to said Josephson junction means.

15. The SQUID system recited in claim 14, wherein said groundplane is formed of niobium.

16. The SQUID system recited in claim 14, wherein said slits are oriented at about ninety degrees with respect to each other.

17. The SQUID system recited in claim 14, wherein at least some of said enlarged openings are generally round.

18. The SQUID system recited in claim 14, wherein said signal coils are electrically balanced and physically symmetrical with respect to each other and are physically symmetrical with respect to said modulation coils.

19. The SQUID system recited in claim 14, wherein modulation coils are electrically balanced and physically symmetrical with respect to said signal coils.

20. The SQUID system recited in claim 18, wherein said signal coils are electrically balanced and physically symmetrical with respect to said bias current applying means.

21. The SQUID system recited in claim 19, wherein said modulation coils are electrically balanced and physically symmetrical with respect to said bias current applying means.

22. The SQUID system recited in claim 14, wherein said bias current is applied by means of a split primary transformer with the current therefrom being applied to opposite sides of said SQUID loop.

23. The SQUID system recited in claim 14, wherein said means for interconnecting said Josephson junction means comprises a superconducting bridge.

24. The SQUID system recited in claim 23, wherein input bias current is applied to said superconducting bridge adjacent each respective Josephson junction means by means of a symmetrical split primary transformer.

25. The SQUID system recited in claim 14, wherein output bias current is connected between one of the primary coils of a split primary transformer for said bias current and to symmetrically positioned locations on said groundplane on diagonally opposite corners of said intersection other than the corners which contain said Josephson junction means.

26. The SQUID system recited in claim 14, wherein said modulation coils are connected together in current aiding series and said signal coils are connected together in current aiding series.

27. A balanced thin film dc SQUID system comprising:
  a substrate;
  a superconductive groundplane layer on said substrate formed with first and second slits forming a mutual intersection intermediate their ends, each said slit having enlarged openings at the end thereof;
  thin film Josephson junction means located on diagonally opposite corners of said groundplane at said intersection of said slits, said Josephson junction means being part of a SQUID loop;
  means for interconnecting said Josephson junction means across said intersection;
  an electrically balanced, physically symmetrical pair of thin film signal coils, each said signal coil being in coupling relationship with one of said enlarged openings at opposite ends of one of said first and second slits;
  a thin film modulation coil in coupling relationship with each said enlarged opening at opposite ends of the other of said first and second slits; and
  means for applying bias current to said Josephson junction means so as to not disturb the symmetry created by said signal coil arrangement.

28. The SQUID system recited in claim 27, wherein said groundplane is formed of niobium.

29. The SQUID system recited in claim 27, wherein said slits are oriented at about ninety degrees with respect to each other.

30. The SQUID system recited in claim 27, wherein at least some of said enlarged openings are generally round.

31. The SQUID system recited in claim 27, wherein said modulation coils are electrically balanced and physically symmetrical with respect to each other and are physically symmetrical with respect to said signal coils.

32. The SQUID system recited in claim 27, wherein said bias current is applied to said Josephson junction means in an electrically balanced, physically and electrically symmetrical manner.

33. The SQUID system recited in claim 31, wherein said bias current is applied to said Josephson junction means in an electrically balanced, physically and electrically symmetrical manner.

34. The SQUID system recited in claim 32, wherein said bias current is applied by means of a split primary transformer with the current therefrom being applied to opposite sides of said SQUID loop.

35. The SQUID system recited in claim 33, wherein said bias current is applied by means of a split primary transformer with the current therefrom being applied to opposite sides of said SQUID loop.

36. The SQUID system recited in claim 27, wherein said means for interconnecting said Josephson junction means comprises a superconducting bridge.

37. The SQUID system recited in claim 36, wherein input bias current is applied to said superconducting bridge adjacent each respective Josephson junction means by means of a symmetrical split primary transformer.

38. The SQUID system recited in claim 27, wherein output bias current is connected between one of the primary coils of a split primary transformer for said bias current and to symmetrically positioned locations on said groundplane on diagonally opposite corners of said intersection other than the corners which contain said Josephson junction means.

39. The SQUID system recited in claim 27, wherein said modulation coils are connected together in current aiding series and said signal coils are connected together in current aiding series.

40. A balanced thin film dc SQUID system comprising:
a substrate;
a superconductive groundplane layer on said substrate formed with first and second slits forming a mutual intersection intermediate their ends, each said slit having enlarged openings at the end thereof;
thin film Josephson junction means located on diagonally opposite corners of said groundplane at said intersection of said slits, said Josephson junction means being part of a SQUID loop;
means for interconnecting said Josephson junction means across said intersection;
an electrically balanced, physically symmetrical pair of thin film signal coils, each said signal coil being in coupling relationship with one of said enlarged openings at opposite ends of one of said first and second slits;
an electrically balanced, physically symmetrical pair of thin film modulation coils, each said modulation coil being in coupling relationship with one of said enlarged openings at opposite ends of the other of said first and second slits, said pair of modulation coils being electrically and physically symmetrical with respect to said signal coils; and
means for symmetrically applying bias current to said Josephson junction means so as to enhance the symmetry created by said signal coil and modulation coil arrangement.

41. The SQUID system recited in claim 40, wherein said groundplane is formed of niobium.

42. The SQUID system recited in claim 40, wherein said slits are oriented at about ninety degrees with respect to each other.

43. The SQUID system recited in claim 40, wherein at least some of said enlarged openings are generally round.

44. The SQUID system recited in claim 40, wherein said bias current is applied to said Josephson junction means in an electrically balanced, physically and electrically symmetrical manner.

45. The SQUID system recited in claim 44, wherein said bias current is applied by means of a split primary transformer with the current therefrom being applied to opposite sides of said SQUID loop.

46. The SQUID system recited in claim 40, wherein said means for interconnecting said Josephson junction means comprises a superconducting bridge.

47. The SQUID system recited in claim 46, wherein input bias current is applied to said superconducting bridge adjacent each respective Josephson junction means by means of a symmetrical split primary transformer.

48. The SQUID system recited in claim 40, wherein output bias current is connected between one of the primary coils of a split primary transformer for said bias current and to symmetrically positioned locations on said groundplane on diagonally opposite corners of said intersection other than the corners which contain said Josephson junction means.

49. The SQUID system recited in claim 40, wherein said modulation coils are connected together in current aiding series and said signal coils are connected together in current aiding series.

* * * * *